US012597116B2

(12) United States Patent
Lee et al.

(10) Patent No.: US 12,597,116 B2
(45) Date of Patent: Apr. 7, 2026

(54) AUTOMATIC DETECTION OF MASK DEFECTS IN SEMICONDUCTOR PROCESSING

(71) Applicant: International Business Machines Corporation, Armonk, NY (US)

(72) Inventors: Choong Ho Lee, Hopewell Junction, NY (US); Donguk Choi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 267 days.

(21) Appl. No.: 18/515,934

(22) Filed: Nov. 21, 2023

(65) Prior Publication Data

US 2025/0166159 A1 May 22, 2025

(51) Int. Cl.
G06T 7/00 (2017.01)
G03F 1/82 (2012.01)
G06T 7/70 (2017.01)

(52) U.S. Cl.
CPC .............. *G06T 7/0006* (2013.01); *G03F 1/82* (2013.01); *G06T 7/001* (2013.01); *G06T 7/70* (2017.01); *G06T 2207/30148* (2013.01)

(58) Field of Classification Search
None
See application file for complete search history.

(56) References Cited

U.S. PATENT DOCUMENTS

| | | | |
|---|---|---|---|
| 5,353,116 A | 10/1994 | Tanigawa | |
| 6,076,465 A * | 6/2000 | Vacca | G03F 1/84 |
| | | | 101/481 |
| 7,227,628 B1 | 6/2007 | Sullivan et al. | |
| 7,711,514 B2 * | 5/2010 | Park | G05B 23/0221 |
| | | | 702/123 |
| 7,975,245 B2 | 7/2011 | Florence | |
| 8,194,968 B2 | 6/2012 | Park | |
| 9,002,497 B2 | 4/2015 | Volk | |
| 9,235,885 B2 | 1/2016 | Amzaleg | |
| 9,485,846 B2 | 11/2016 | Weng | |
| 10,026,011 B2 * | 7/2018 | Tsuchiya | G06T 7/001 |
| 10,634,623 B2 | 4/2020 | Zhang | |

(Continued)

FOREIGN PATENT DOCUMENTS

| | | |
|---|---|---|
| JP | 4758343 B2 | 8/2011 |
| JP | 5974037 B2 | 8/2016 |

*Primary Examiner* — Stephen R Koziol
(74) *Attorney, Agent, or Firm* — Scott Dobson

(57) ABSTRACT

Detecting mask defects during semiconductor processing includes scanning, by one or more processors, a wafer during a lithography process of semiconductor processing. A first chip of a plurality of chips on the wafer is compared with a neighboring chip. In response to detecting a defect on the first chip during the comparison, a location of the defect on the first chip is stored by the one or more processors. The one or more processors select a second chip of the plurality of chips closest to a center of the wafer and scan the second chip storing inspection data corresponding to the second chip. The inspection data from the second chip is then compared with mask pattern data, and in response to the inspection data from the second chip matching the mask pattern data, the one or more processors allow the lithography process to continue.

20 Claims, 5 Drawing Sheets

(56)     References Cited

U.S. PATENT DOCUMENTS

| | | | |
|---|---|---|---|
| 2006/0110025 A1* | 5/2006 | Ho | G03F 1/84 |
| | | | 382/144 |
| 2008/0133160 A1* | 6/2008 | Vacca | G06T 7/0004 |
| | | | 702/81 |
| 2009/0043527 A1* | 2/2009 | Park | G05B 23/0221 |
| | | | 702/123 |
| 2010/0208978 A1* | 8/2010 | Terasawa | G03F 7/70941 |
| | | | 382/145 |
| 2011/0161893 A1* | 6/2011 | Lin | G03F 1/72 |
| | | | 430/5 |
| 2014/0212021 A1* | 7/2014 | Amzaleg | G06T 7/001 |
| | | | 382/149 |
| 2021/0342992 A1* | 11/2021 | Chen | G01N 21/9501 |

* cited by examiner

100

COMPUTER  101

PROCESSOR SET 110

| PROCESSING CIRCUITRY 120 | CACHE 121 |

COMMUNICATION FABRIC 111

VOLATILE MEMORY 112

PERSISTENT STORAGE 113

OPERATING SYSTEM 122

AUTOMATIC DETECTION OF MASK DEFECTS CODE

200

PERIPHERAL DEVICE SET 114

| UI DEVICE SET 123 | STORAGE 124 | IoT SENSOR SET 125 |

NETWORK MODULE 115

WAN 102

END USER DEVICE 103

REMOTE SERVER 104

REMOTE DATABASE 130

PRIVATE CLOUD 106

GATEWAY 140

PUBLIC CLOUD 105

CLOUD ORCHESTRATION MODULE 141

HOST PHYSICAL MACHINE SET 142

VIRTUAL MACHINE SET 143

CONTAINER SET 144

*FIG. 1*

AUTOMATIC DETECTION OF MASK DEFECTS IN SEMICONDUCTOR PROCESSING

BACKGROUND

The present invention generally relates to the field of semiconductor devices, and more particularly to detection of mask defects.

Electronic devices of the same pattern are typically disposed side by side on a semiconductor wafer. Wafer defects are often caused by particles such as dust and can occur in random positions. The possibility that defects occur repeatedly or systematically in a specific position within the wafer is extremely low.

Patterned wafer inspection system can detect defects by comparing pattern images of adjacent chips (also called dies) and obtaining the difference. There are many types of patterned wafer inspection systems including, for example, electron beam inspection systems, bright-field inspection systems, and dark-field inspection systems. Each of these inspection systems has its own features, but the basic defect detection principles are the same. The pattern on the wafer is captured along the die array by electron beam or light. Defects are detected by comparison between a first image corresponding to the die to be inspected and a second image corresponding to an adjacent die. If there are no defects, the result of the subtraction of the second image from the first image by digital processing will be zero and no defects are detected. In contrast, if there is a defect in the second image of the adjacent die, the defect will remain in the subtracted image. The defect is then detected and its position coordinates are registered. Unfortunately, defect detection by comparing pattern images of adjacent chips may not be suitable for larger size chips and may require wafer lots be put on hold until the mask is verified as defect-free.

SUMMARY

The present disclosure recognizes the shortcomings and problems associated with detection of mask defects in semiconductor processing.

Shortcomings of the prior art are overcome and additional advantages are provided through the provision of a computer-implemented method for detecting a mask defect. The method includes scanning, by one or more processors, a wafer during a lithography process of semiconductor processing, comparing, by the one or more processors, a first chip of a plurality of chips on the wafer with a neighboring chip, storing, by the one or more processors, a location of a defect on the first chip, in response to detecting the defect on the first chip during the comparison, selecting, by the one or more processors, a second chip of the plurality of chips closest to a center of the wafer, scanning, by the one or more processors, the second chip and storing inspection data corresponding to the second chip, comparing, by the one or more processors, the inspection data from the second chip with mask pattern data, and in response to the inspection data from the second chip matching the mask pattern data, allowing, by the one or more processors, the lithography process to continue.

Another embodiment of the present disclosure provides a computer system for detecting a mask defect, based on the method described above.

Another embodiment of the present disclosure provides a computer program product for detecting a mask defect, based on the method described above.

BRIEF DESCRIPTION OF THE DRAWINGS

The following detailed description, given by way of example and not intended to limit the invention solely thereto, will best be appreciated in conjunction with the accompanying drawings, in which:

FIG. 1 is a block diagram illustrating a networked computer environment, according to an embodiment of the present disclosure;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 2A:
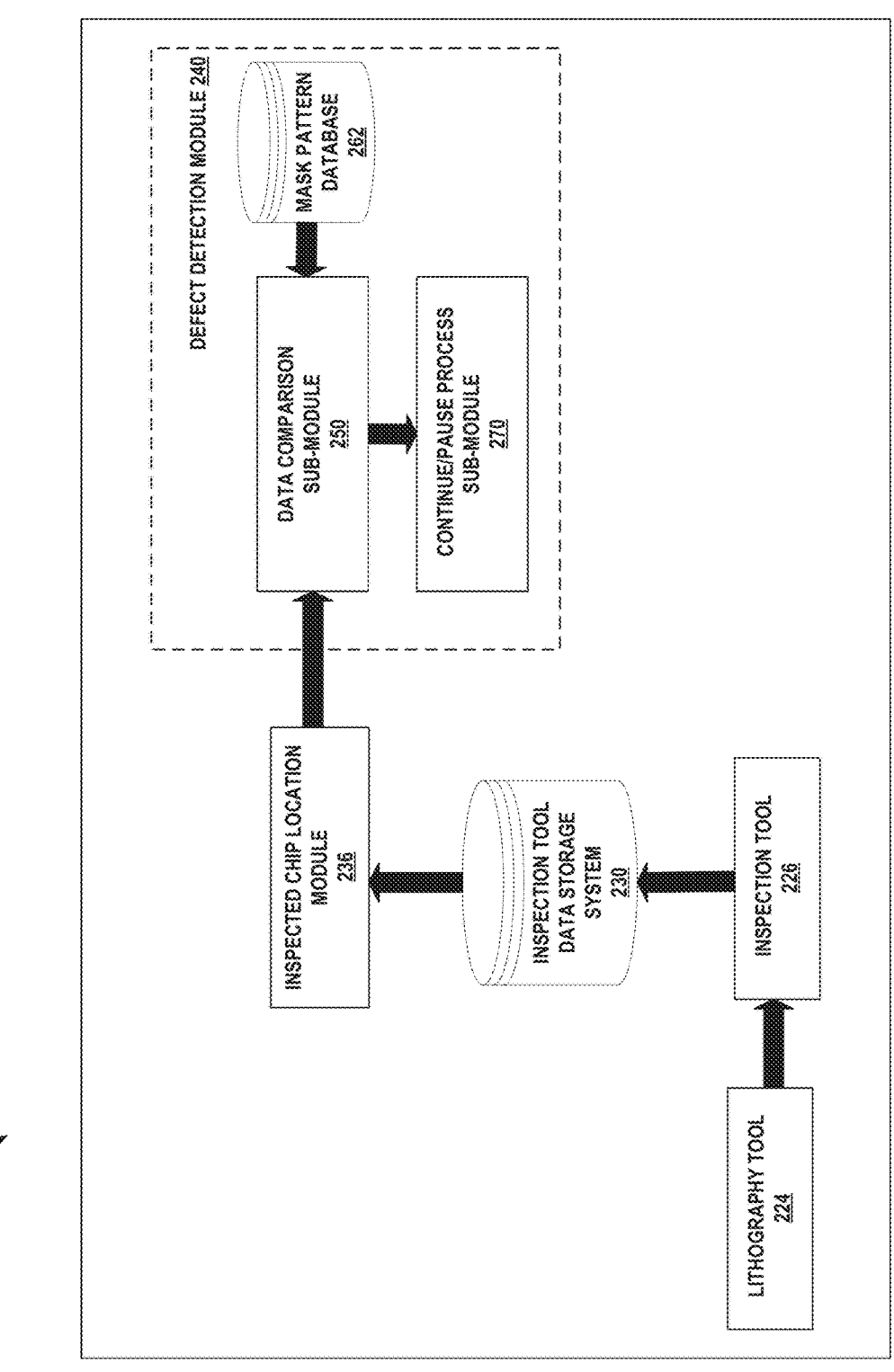
FIG. 2A is a functional block diagram depicting components of a computer system for automatic detection of mask defects, according to an embodiment of the present disclosure.

The following description with reference to the accompanying drawings is provided to assist in a comprehensive understanding of exemplary embodiments of the invention as defined by the claims and their equivalents. The description includes various specific details to assist in that understanding, but these are to be regarded as merely exemplary, and assist in providing clarity and conciseness. Accordingly, those of ordinary skill in the art will recognize that various changes and modifications of the embodiments described herein can be made without departing from the scope and spirit of the invention. In addition, descriptions of well-known functions and constructions may be omitted.

The terms and words used in the following description and claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

Embodiments and figures of the present disclosure may have the same or similar components as other embodiments. Such figures and descriptions illustrate and explain further examples and embodiments according to the present disclosure. Embodiments of the present disclosure can include operational actions and/or procedures. A method, such as a computer-implemented method, can include a series of operational blocks for implementing an embodiment according to the present disclosure which can include cooperation with one or more systems shown in the figures. The operational blocks of the methods and systems according to the present disclosure can include techniques, mechanism, modules, and the like for implementing the functions of the operations in accordance with the present disclosure. Similar components may have the same reference numerals. Components can operate in concert with a computer implemented method.

As the dimensions of advanced semiconductor devices continue to shrink, the presence of defects in the semiconductor devices limits the successful fabrication, or yield, of a semiconductor device. For example, a mask or reticle defect reproduced in a resist patterned during lithography may cause an open circuit or a short circuit in a semiconductor device formed in subsequent processing. Because fabrication of a semiconductor device includes many complex process steps, the adverse effects of defects on total yield may increase exponentially if an error that is caused by a defect is propagated throughout an entire manufacturing process or operation over time.

Particle induced defects on a mask or reticle include repeatable defects which can be difficult to detect by conventional inspection tools. Defects repeated within each semiconductor device formed on an entire specimen may, for example, be systematically caused by contamination or defects found on a reticle, or a mask. Contamination or defects on a reticle may be transferred along with a device pattern to a resist during a lithography process, i.e., the process of transferring a mask pattern onto a substrate. These repeatable defects can be difficult to detect using conventional inspection tools since the inspection is conducted by comparing neighboring chips. This can make particularly challenging detecting defects when a chip is sufficiently large to cover the entire mask surface. An alternative includes applying a pellicle to the mask for reducing the impact of mask defects in EUV systems. However, pellicles for EUV tools have not been fully developed and the throughput of the EUV tool can be significantly reduced when the pellicle is applied to the mask. Thus, a more viable solution is holding wafer lots after a lithography process to conduct mask inspection until the mask(s) is proven to be defect-free. However, continuously holding wafer lots to perform mask inspections may cause significant delays on the semiconductor manufacturing process.

Embodiments of the present disclosure provide a method, system, and computer program product for conducting mask inspection during a lithography process without holding wafer lots. More particularly, embodiments of the present disclosure provide a mask defect detection system that uses wafer defect inspection data and design data to minimize the idle time resulting from the mask inspection and verification processes.

While current mask verification processes require unloading a mask from the scanner system to inspect the mask, embodiments of the present disclosure allow the mask to be kept in the scanner system unless a critical mask defect (e.g., a yield or performance-impacting defect) is shown during inspection of a semiconductor wafer processed with the mask. Accordingly, the mask is unloaded and mask defects are cleared only when one or more critical mask defects are found on the wafer. By doing this there is no need to unload the mask to inspect it or wait for the mask inspection result when there is no critical mask defect. In embodiments in which there are multiple chips per mask, data of non-repeating defects during wafer inspection are excluded to build the best chip inspection data. And then, mask defects are detected by comparing the design data with the best chip inspection data.

Therefore, the following described exemplary embodiments may, among other things, detect mask defects during semiconductor processing without holding wafer lots. The present embodiments have the capacity to improve the technical field of detection of mask defects by providing an automatic mask defect detection system that can continuously detect mask defects after a lithography process without stopping the semiconductor manufacturing process. More particularly, embodiments of the present disclosure are capable of scanning a wafer during a lithography process, comparing a chip with a neighboring chip, finding defects on the scanned wafer, storing a location of the detected defects, selecting a chip ($\alpha$, $\beta$) closest to the wafer center, scanning the chip ($\alpha$, $\beta$) and storing the chip ($\alpha$, $\beta$) inspection data as a selected chip data INSP [Chip ($\alpha$, $\beta$)], comparing the INSP [Chip ($\alpha$, $\beta$) data with the mask pattern data, and based on the INSP [Chip ($\alpha$, $\beta$)] data and mask pattern data being the same, allowing the photolithography process to continue without interruptions. In embodiments in which the INSP [Chip ($\alpha$, $\beta$)] data and the mask pattern data are not the same, embodiments of the present disclosure may hold the lithography process to start a mask cleaning process.

Referring now to FIG. 1, an exemplary computing environment 100 is depicted, according to an embodiment of the present disclosure.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation, or garbage collection, but this does not render the storage device as transitory because the data is not transitory while it is stored.

Computing environment 100 contains an example of an environment for the execution of at least some of the computer code involved in performing the inventive methods, such as the program code 200 for automatic detection of mask defects in semiconductor processing. In addition to program code 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and program code 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network, or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in program code 200 in persistent storage 113.

COMMUNICATION FABRIC 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read-only memory (ROM), but typically at least a portion of the persistent storage allows writing of data, deletion of data and re-writing of data. Some familiar forms of persistent storage include magnetic disks and solid-state storage devices. Operating system 122 may take several forms, such as various known proprietary operating systems or open-source Portable Operating System Interface type operating systems that employ a kernel. The code included in program code 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101) and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on. According to an embodiment, the program code 200 is communicatively connected to IoT sensor set 125 and EUD 103 via WAN 102 for actively monitoring, upon user's approval, a network traffic on a user's side and interactions between the user and IoT sensor set 125.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Figure 2B:
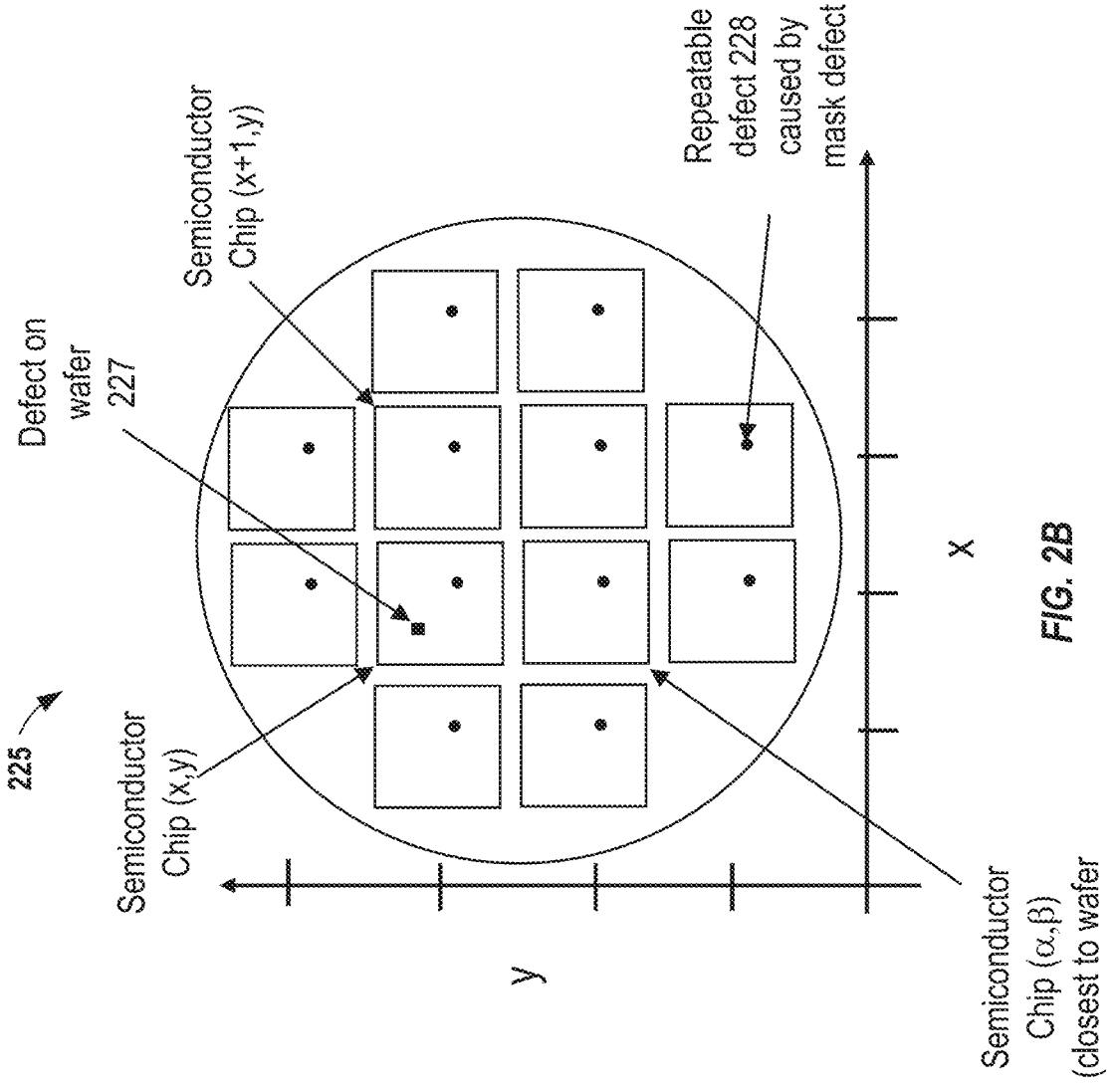
FIG. 2B depicts a chip selection process on a wafer to be used for automatic detection of mask defects, according to an embodiment of the present disclosure.
Figure 2C:
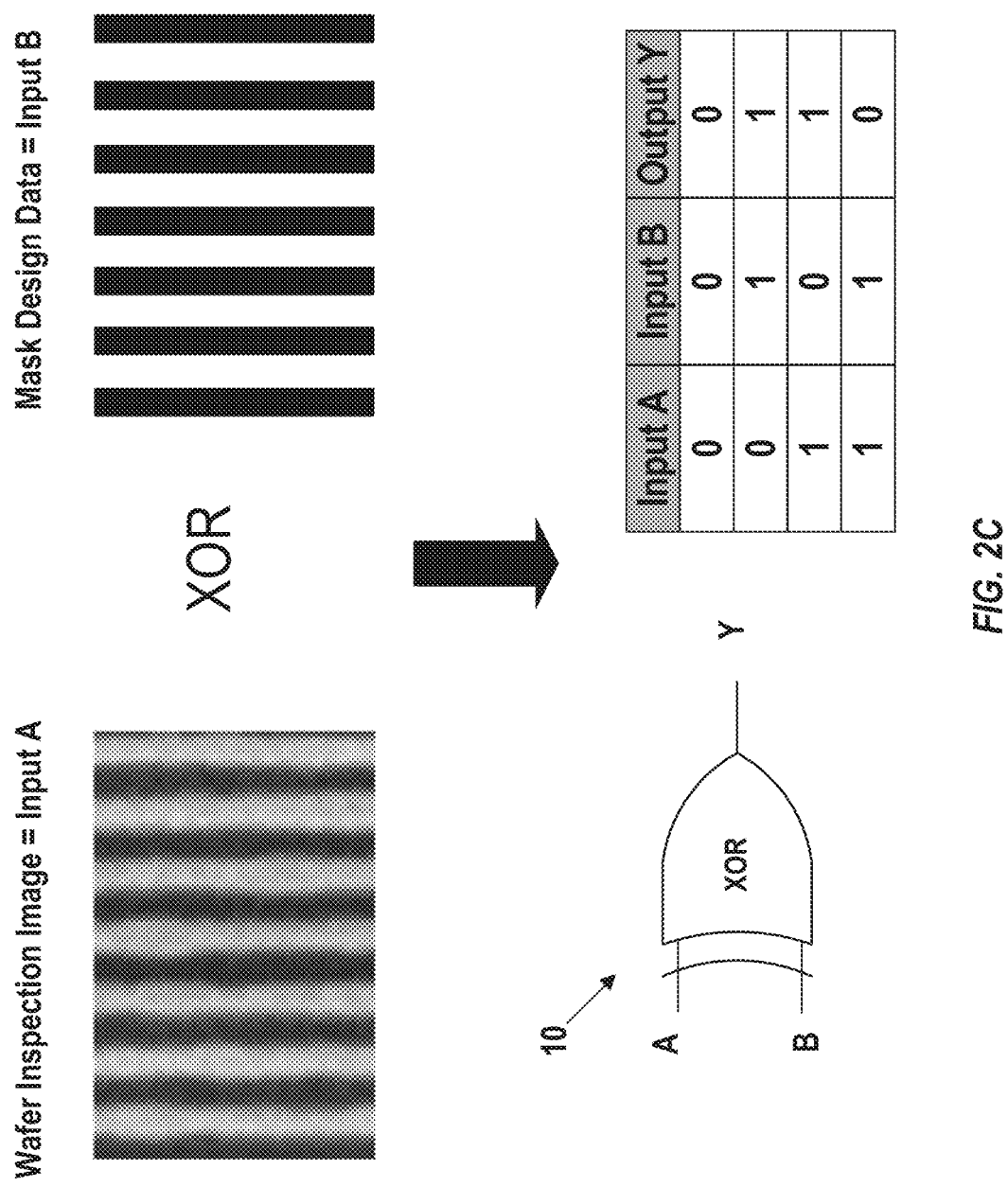
FIG. 2C depicts a process for determining wafer inspection data matching mask pattern data, according to an embodiment of the present disclosure.

Referring now to FIGS. 2A-2C simultaneously, a functional block diagram depicting components of a computer system 220 for executing the program code 200 (FIG. 1) for detection of mask defects is shown, according to an embodiment of the present disclosure. FIGS. 2A-2C provide only an illustration of one implementation and do not imply any limitations with regard to the environments in which different embodiments may be implemented. Many modifications to the depicted environment may be made by those skilled in the art without departing from the scope of the invention as recited by the claims.

Fabrication of semiconductor devices such as logic and memory devices typically includes processing a semiconductor wafer using a number of semiconductor fabrication processes to form various features and multiple levels of the semiconductor devices. Lithography is a semiconductor fabrication process that typically involves transferring a pattern to a resist arranged on a semiconductor wafer. During lithography, and other semiconductor fabrication processes, defects such as particulate contamination and pattern defects may be introduced into semiconductor devices. As the dimensions of advanced semiconductor devices continue to shrink, the presence of defects in the semiconductor devices limits the successful fabrication, or yield, of a semiconductor device. For example, a mask defect reproduced in a resist patterned during lithography may cause an open circuit or a short circuit in a semiconductor device formed in subsequent processing. Because fabrication of a semiconductor device includes many complex process steps, the adverse effects of defects on total yield may increase exponentially if an error that is caused by a defect is propagated throughout an entire manufacturing process or operation over time.

Computer system 220, as depicted in FIG. 2, provides an implementation of a mask defect detection system that can potentially reduce adverse effects of mask defects.

According to an embodiment, the computer system 220 for detection of mask defects includes a lithography tool 224 coupled to an inspection tool 226. The inspection tool 226 is coupled to an inspection tool data storage system 230 which is communicatively connected to an inspected chip location module 236. The computer system 220 for mask defect detection further includes a defect detection module 240 communicatively connected to the inspected chip location module 236. The defect detection module 240 is composed of a data comparison sub-module 250 communicatively connected to a mask pattern database 262 storing mask pattern data, and a pause/continue sub-module 270.

In one or more embodiments, the lithography tool 224, inspection tool 226, inspection tool data storage system 230, inspected chip location module 236 and defect detection module 240 are communicatively connected via a network such as WAN 102 depicted in FIG. 1. In other embodiments, the lithography tool 224, inspection tool 226, inspection tool data storage system 230, inspected chip location module 236 and defect detection module 240 are coupled by transmission media such as wires, cables, wireless transmission paths, and/or a network. The transmission media may include "wired" and "wireless" portions.

The lithography tool 224 may include any lithography equipment now known or later developed. For example, in one embodiment, lithography tool 224 may include an extreme ultraviolet (EUV) lithography system.

Inspection tool 226 may be used to inspect a semiconductor wafer (or substrate) similar to semiconductor wafer 225 shown in FIG. 2A. The semiconductor wafer may be inspected using any method known in the art. In an embodiment, inspection tool 226 may include any wafer inspection equipment now known or later developed. For example, in one embodiment, inspection tool 226 may include electron beam inspection systems, bright-field inspection systems, and dark-field inspection systems.

As wafer lots move from the lithography tool 224 to the inspection tool 226, inspection data can be obtained from the inspection tool 226 and stored in the inspection tool data storage system 230. In some embodiments inspection data may be obtained from a Fab database (not shown).

According to an embodiment, the inspected chip location module 236 uses inspection data from the inspection tool data storage system 230 to select a semiconductor chip to be compared with a neighboring semiconductor chip in the semiconductor wafer. For example, as illustrated in FIG. 2B, the inspected chip location module 236 of computer system 220 selects a semiconductor chip with coordinates (x,y) in semiconductor wafer 225 and compares the semiconductor chip (x,y) to a neighboring semiconductor chip of coordinates (x+1,y) to identify potential defects on the semiconductor wafer 225. Accordingly, in response to detecting or identifying a defect on the scanned semiconductor wafer (e.g., semiconductor wafer 225), the inspected chip location module 236 stores a location of the detected defect on the semiconductor wafer. For instance, in the example of FIG. 2B, a defect 227 is found on the semiconductor wafer 225 after comparing semiconductor chip (x,y) and semiconductor chip (x+1,y). In one or more embodiments, the inspected chip location module 236 identifies and stores coordinates of defects 227 detected on the semiconductor wafer 225.

According to an embodiment, the inspected chip location module 236 is capable of determining an address of the semiconductor chip (x,y) that does not overlap with the location of the detected defect 227.

The inspected chip location module 236 further selects a semiconductor chip having a location that is closest to the center of the semiconductor wafer. For example, as shown in FIG. 2B, the inspected chip location module 236 selects a semiconductor chip ($\alpha$, $\beta$) closest to the wafer center. Using a scanning system (not shown), the inspected chip location module 236 scans the semiconductor chip ($\alpha$, $\beta$) and stores the semiconductor chip ($\alpha$, $\beta$) inspection data. According to an embodiment, the inspected chip location module 236 stores inspection data from the semiconductor chip ($\alpha$, $\beta$) as selected chip data INSP [Chip ($\alpha$, $\beta$)].

According to an embodiment, the data comparison sub-module 250 of the defect detection module 240 shown in FIG. 2A compares the INSP [Chip ($\alpha$, $\beta$)] data stored by inspected chip location module 236 with mask pattern data (i.e., mask design data) from the mask pattern database 262. Responsive to the INSP [Chip ($\alpha$, $\beta$)] data and mask pattern data being the same, the continue/pause process sub-module 270 allows the lithography process to continue without interruptions. Stated differently, in one or more embodiments, computer system 220 compares wafer inspection data (e.g., INSP [Chip ($\alpha$, $\beta$)] data) stored as wafer inspection image(s) against mask design data and determines whether the wafer inspection data matches the mask pattern data. For example, FIG. 2C shows a wafer inspection image (Input A) being compared to mask design data (Input B). In such exemplary embodiment, an XOR process 10 can be used to determine instances in which the wafer inspection data (Input A) matches the mask design (also referred to as "mask pattern") data (Input B). As may be understood by those skilled in the art, an output Y of the XOR process 10 equal to zero "0" represents identical data values, i.e., instances in which wafer inspection data (Input A) matches or is the same as mask design data (Input B). Accordingly, the output Y is true (1) if the inputs A, B are not alike otherwise the output Y is false (0). In some embodiments, a noise-reduction threshold value can be defined by a user of computer system 220 to improve the data comparison process (i.e., reduce data noise).

In embodiments in which the INSP [Chip (α, β)] data and the mask pattern data are different from one another, repeatable defects 228 caused by defects on the mask can be identified by the computer system 220. Responsive to the INSP [Chip (α, β)] data and the mask pattern data not being the same, the continue/pause process sub-module 270 may hold the lithography process to start a mask cleaning process.

Accordingly, computer system 220 for detection of mask defects allows processing the wafer with the mask and keeping the wafer in the scanner system during inspection by using wafer defect inspection data (i.e., INSP [Chip (α, β)]) and mask pattern data for defect identification. This minimizes the idle time caused by unloading the mask for inspection. In the computer system 220 for detection of mask defects, the mask is kept in the scanner system unless critical mask defects are detected during inspection of the wafer processed with the mask. The mask is unloaded to get mask defects cleared only when critical mask defects are detected on the wafer. As such, there is no need to unload the mask for inspection or wait for mask inspection results when there is no critical mask defects.

In embodiments in which there are multiple chips per mask, inspection data associated with non-repeating defects during wafer inspection are excluded to build the best chip inspection data. Then, mask defects can be detected by comparing the design mask pattern data with the best chip inspection data. In one or more embodiments, the quality of the mask inspection data can improve the accuracy of the code 200 (FIG. 1) for automatic detection of mask defects.

Figure 3:
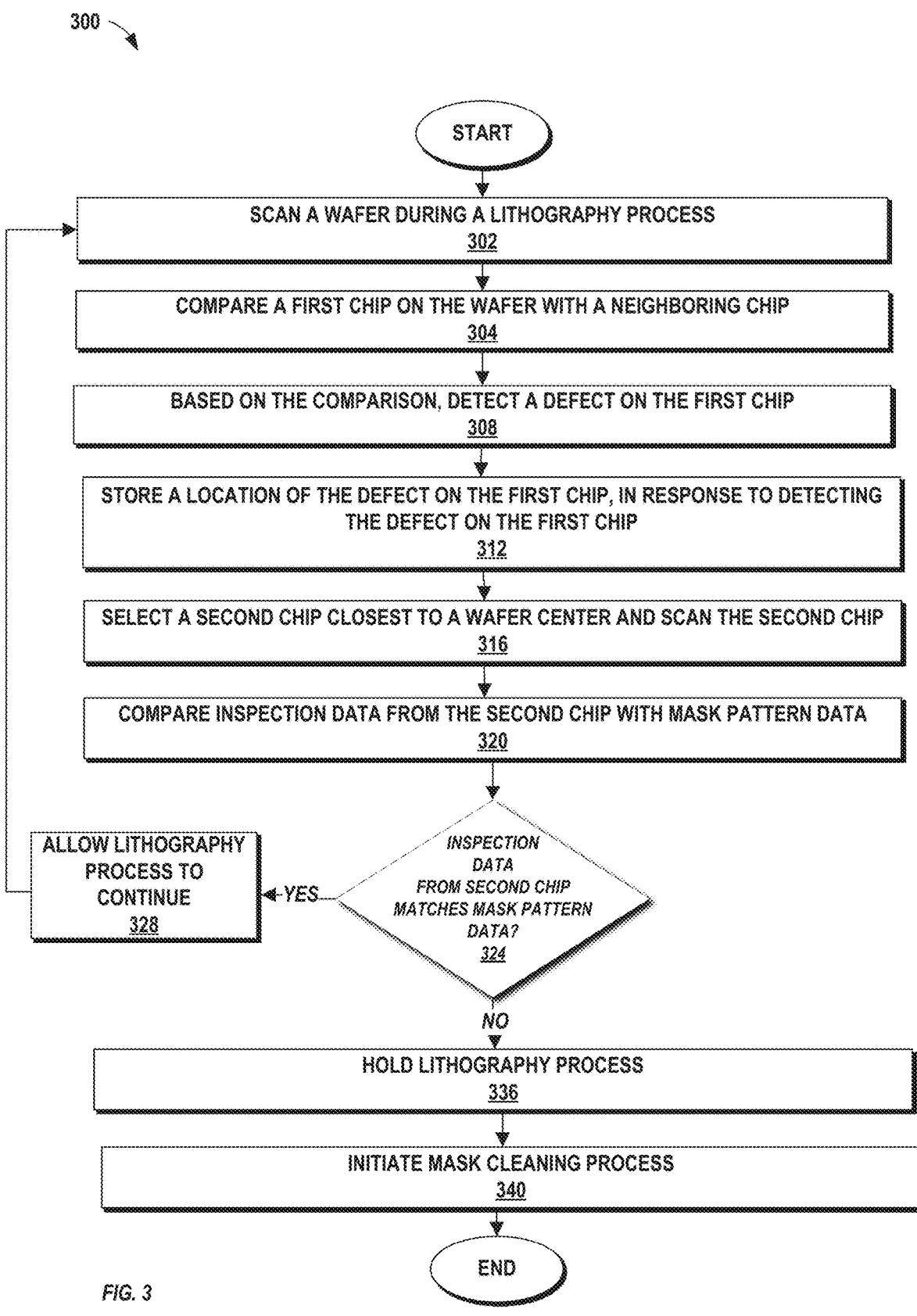
FIG. 3 depicts a flowchart illustrating the steps of a computer-implemented method for automatic detection of mask defects during semiconductor processing, according to an embodiment of the present disclosure.

Referring now to FIG. 3, a flowchart illustrating operational steps of a computer-implemented method 300 for detection of mask defects is shown, according to an embodiment of the present disclosure. FIG. 3 provides only an illustration of one implementation and does not imply any limitations with regard to the environments in which different embodiments may be implemented. Many modifications to the depicted environment may be made by those skilled in the art without departing from the scope of the invention as recited by the claims.

The process starts at step 302 by scanning a semiconductor wafer during a lithography process of semiconductor processing. Inspection data from the scanning of the semiconductor wafer is stored including location coordinates of defects detected on the semiconductor wafer during the scanning. At step 304, a first chip is selected from the stored inspection data and compared with a neighboring chip. According to an embodiment, an address of the first chip that does not overlap with the location of the detected defects can be determined. At step 308, a defect on the first chip can be detected based on the comparison of the first chip with the neighboring chip.

The process continues at step 312 in which a location of the detected defect on the first chip is stored including coordinates of the detected defect. At step 316 a second chip closest to a center of the semiconductor wafer is selected from the inspection data. Also, at step 316, the second chip is scanned by a scanning system. At step 320, inspection data resulting from scanning the second chip is compared with mask pattern data (i.e., design data). The mask pattern data can be stored in a mask pattern database or fab database.

At step 324, the method 300 determines whether inspection data from the second chip matches the mask pattern data. If the method 300 determines that the inspection data from the second chip matches the mask pattern data, the method 300 allows the lithography process to continue at step 328. In embodiments in which the method 300 determines that the inspection data from the second chip is different from the mask pattern data, the method 300 holds the lithography process at step 336, and initiates a mask cleaning process at step 340.

The method as described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The present invention may be a system, a method, and/or a computer program product. The computer program product may include a computer readable storage medium (or media) having computer readable program instructions thereon for causing a processor to carry out aspects of the present invention.

Computer readable program instructions described herein may be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, may be implemented by computer readable program instructions.

These computer readable program instructions may be provided to a processor of a general-purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that may direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the Figures (i.e., FIG.) illustrate the architecture, functionality, and operation of possible implementations of systems, methods, and computer program products according to various embodiments of the present invention. In this regard, each block in the flowchart or block diagrams may represent a module, a segment, or a portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method for detecting a mask defect, comprising:

scanning, by one or more processors, a wafer during a lithography process of semiconductor processing;

comparing, by the one or more processors, a first chip of a plurality of chips on the wafer with a neighboring chip;

storing, by the one or more processors, a location of a defect on the first chip, in response to detecting the defect on the first chip during the comparison;

selecting, by the one or more processors, a second chip of the plurality of chips closest to a center of the wafer;

scanning, by the one or more processors, the second chip and storing inspection data corresponding to the second chip;

comparing, by the one or more processors, the inspection data from the second chip with mask pattern data; and in response to the inspection data from the second chip matching the mask pattern data, allowing, by the one or more processors, the lithography process to continue.

2. The method of claim 1, further comprising:

determining, by the one or more processors, when the inspection data from the second chip matches the mask pattern data; and in response to the inspection data from the second chip being different from the mask pattern data, holding the lithography process of the wafer.

3. The method of claim 2, further comprising:

initiating a mask cleaning process, in response to the data from the second chip being different from the mask pattern data.

4. The method of claim 1, further comprising:

identifying, by the one or more processors, an address of the first chip, wherein the address of the first chip does not overlap the location of the defect on the first chip.

5. The method of claim 1, wherein storing the location of the defect on the first chip comprises storing coordinates of the location of the defect on the first chip.

6. The method of claim 1, wherein scanning the second chip includes using a scanning system.

7. The method of claim 1, wherein the mask pattern data is obtained from at least one of a mask pattern database or fab database.

8. A computer system for detecting a mask defect, comprising:

one or more processors, one or more computer-readable memories, one or more computer-readable tangible storage devices, and program instructions stored on at least one of the one or more storage devices for execution by at least one of the one or more processors via at least one of the one or more memories, wherein the computer system is capable of performing a method comprising:

scanning, by the one or more processors, a wafer during a lithography process of semiconductor processing;

comparing, by the one or more processors, a first chip of a plurality of chips on the wafer with a neighboring chip;

storing, by the one or more processors, a location of a defect on the first chip, in response to detecting the defect on the first chip during the comparison;

selecting, by the one or more processors, a second chip of the plurality of chips closest to a center of the wafer;

scanning, by the one or more processors, the second chip and storing inspection data corresponding to the second chip;

comparing, by the one or more processors, the inspection data from the second chip with mask pattern data; and in response to the inspection data from the second chip matching the mask pattern data, allowing, by the one or more processors, the lithography process to continue.

9. The computer system of claim 8, further comprising:

determining, by the one or more processors, when the inspection data from the second chip matches the mask pattern data; and in response to the inspection data from the second chip being different from the mask pattern data, holding the lithography process of the wafer.

10. The computer system of claim 9, further comprising:

initiating a mask cleaning process, in response to the data from the second chip being different from the mask pattern data.

11. The computer system of claim 8, further comprising:

identifying, by the one or more processors, an address of the first chip, wherein the address of the first chip does not overlap the location of the defect on the first chip.

12. The computer system of claim 8, wherein storing the location of the defect on the first chip comprises storing coordinates of the location of the defect on the first chip.

13. The computer system of claim 8, wherein scanning the second chip includes using a scanning system.

14. The computer system of claim 8, wherein the mask pattern data is obtained from at least one of a mask pattern database or fab database.

15. A computer program product for detecting a mask defect, comprising:

one or more computer readable storage media, and program instructions collectively stored on the one or more computer readable storage media, the program instructions comprising:

program instructions to scan, by one or more processors, a wafer during a lithography process of semiconductor processing;

program instructions to compare, by the one or more processors, a first chip of a plurality of chips on the wafer with a neighboring chip;

program instructions to store, by the one or more processors, a location of a defect on the first chip, in response to detecting the defect on the first chip during the comparison;

program instructions to select, by the one or more processors, a second chip of the plurality of chips closest to a center of the wafer;

program instructions to scan, by the one or more processors, the second chip and storing inspection data corresponding to the second chip;

program instructions to compare, by the one or more processors, the inspection data from the second chip with mask pattern data; and in response to the inspection data from the second chip matching the mask pattern data, program instructions to allow, by the one or more processors, the lithography process to continue.

16. The computer program product of claim 15, further comprising:

determining, by the one or more processors, when the inspection data from the second chip matches the mask pattern data; and in response to the inspection data from the second chip being different from the mask pattern data, holding the lithography process of the wafer.

17. The computer program product of claim 16, further comprising:

initiating a mask cleaning process, in response to the data from the second chip being different from the mask pattern data.

18. The computer program product of claim 15, further comprising:

identifying, by the one or more processors, an address of the first chip, wherein the address of the first chip does not overlap the location of the defect on the first chip.

19. The computer program product of claim 15, wherein storing the location of the defect on the first chip comprises storing coordinates of the location of the defect on the first chip.

20. The computer program product of claim 15, wherein scanning the second chip includes using a scanning system, and wherein the mask pattern data is obtained from at least one of a mask pattern database or fab database.

\* \* \* \* \*